(12) United States Patent
Carlisle et al.

(10) Patent No.: US 8,197,701 B2
(45) Date of Patent: Jun. 12, 2012

(54) DIAMOND FILM DEPOSITION AND PROBES (75) Inventors: John A. Carlisle, Plainfield, IL (US);
Nicolaie Moldovan, Plainfield, IL (US)

(73) Assignee: Advanced Diamond Technologies, Inc., Romeoville, IL (US)

( * ) Notice: Subject to any disclaimer, the term of this patent is extended or adjusted under 35 U.S.C. 154(b) by 796 days.

(21) Appl. No.: 12/172,109

(22) Filed: Jul. 11, 2008

(65) Prior Publication Data
US 2009/0148652 A1 Jun. 11, 2009

Related U.S. Application Data (60) Provisional application No. 60/929,808, filed on Jul. 13, 2007.

(51) Int. Cl.
*B44C 1/22* (2006.01)
*C25F 3/00* (2006.01)

(52) U.S. Cl. .................. 216/11; 216/2; 216/41; 216/58; 216/83

(58) Field of Classification Search ................ 216/2, 11, 216/41, 58, 83
See application file for complete search history.

(56) References Cited

U.S. PATENT DOCUMENTS

| | | | |
|---|---|---|---|
| 5,066,358 A | | 11/1991 | Quate et al. |
| 5,135,807 A | * | 8/1992 | Ito et al. .......................... 428/334 |
| 5,221,415 A | * | 6/1993 | Albrecht et al. ................... 216/2 |
| 5,849,079 A | | 12/1998 | Gruen et al. |
| H1792 H | * | 4/1999 | Moran et al. .................... 427/585 |
| 5,994,160 A | | 11/1999 | Niedermann et al. |
| 7,128,889 B2 | | 10/2006 | Carlisle et al. |
| 2003/0064225 A1 | * | 4/2003 | Ohashi et al. ................... 428/408 |
| 2005/0031785 A1 | | 2/2005 | Carlisle et al. |
| 2006/0113546 A1 | * | 6/2006 | Sung ................................. 257/77 |
| 2007/0220959 A1 | * | 9/2007 | Sumant et al. ................... 73/105 |
| 2007/0257265 A1 | * | 11/2007 | Naguib et al. ................... 257/77 |

OTHER PUBLICATIONS

Kim, K-H., et al., "Novel Ultrananocrystalline Diamond probes for High-Resolution Low-Wear Nanolithographic Techniques", Small, vol. 1, No. 8-9, pp. 866-874 (2005).
May, P. W., et al., "Experiment and modeling of the deposition of ultrananocrystalline diamond films using hot filament chemical vapor deposition and $Ar/CH_4/H_2$ gas mixtures: A generalized mechanism for ultrananocrystalline diamond growth", J. Appl. Phys., vol. 100, pp. 024301-1 through 024301-9 (2006).
Naguib, N. N., et al., "Enhanced nucleation, smoothness and conformality of ultrananocrystalline diamond (UNCD) ultrathin films via tungsten interlayers", Chem. Phys. Letts., vol. 430, pp. 345-350 (2006).
Scholz, W., et al., "Fabrication of Monolithic Diamond Probes for Scanning Probe Microscopy Applications", SPIE, vol. 3009, pp. 61-71 (1997).
PCT/US2008/069872 filed Jul. 11, 2008, Intl. Search Report & Written Opinion, mailed Oct. 14, 2008 (15 pages).
U.S. Appl. No. 11/775,846, filed Jul. 10, 2007, Carlisle et al.
Angadi et al., "Thermal Transport and Grain Boundary Conductance in Ultrananocrystalline Diamond Thin Films", J. Appl. Phys., vol. 99, pp. 114-301 (2006).

(Continued)

*Primary Examiner* — Shamim Ahmed
(74) *Attorney, Agent, or Firm* — Foley & Lardner LLP (57) ABSTRACT

Diamond SPM and AFM probes which are durable, particularly for scanning hard surfaces such as diamond surfaces. Interlayers and seeding can be used to improve diamond deposition, and the diamond can be ultrananocrystalline diamond (UNCD). Tip sharpening improves resolution.

33 Claims, 13 Drawing Sheets

OTHER PUBLICATIONS

Birrell et al., Interpretation of the Raman Spectra of Ultrananocrystalline Diamond, Diamond & Relat. Mater., vol. 14, pp. 86 (2005).

Birrell et al., Morphology and Electronic Structure of Nitrogen-doped Ultrananocrystalline Diamond, Appl. Phys. Lett., vol. 81, pp. 2235 (2002).

Carlisle et al., "Characterization of nanocrystalline diamond films by core-level photoabsorption", Appl. Phys. Lett., vol. 68, pp. 1640 (1996).

Espinosa et al., Mechanical Properties of Ultrananocrystalline Diamond Thin Films Relevant to MEMS Devices, Exper. Mech., vol. 43, No. 3, pp. 256-268 (2003).

Gruen, "Nanocrystalline Diamond Films," Annu. Rev. Mater. Sci., vol. 29, pp. 211 (1999).

Handbook of Industrial Dismonds and Diamond Films (1998).

May et al., "Experiment and modeling of the deposition of ultrananocrystalline diamond films using hot filament chemical vapor deposition and Ar/CH4/H2 gas mixtures: A generalized mechanism for ultrananocrystalline diamond growth." J. Appl. Phys., vol. 100, pp. 024301 (2006).

May et al., "Reevaluation of the mechanism for ultrananocrytalline diamond deposition from Ar/CH4/H2 gas mixtures", J. Appl. Phys., vol. 99, pp. 104907 (2006).

May et al., Microcrystalline, nanocrystalline and ultrananocrystalline diamond chemical vapor deposition: Experiment and modeling of the factors controlling growth rate, nucleation and crystal size, J. Appl. Phys., vol. 101, pp. 053115 (2007).

Naquib et al., "Enhanced Nucleation, Smoothness and Conformality of Ultrananocrystalline Diamond (UNCD) Ultrathin Films Via Tunsten Iterdavers," Chem Phys. Lett. vol. 430, iss. 4-6, pp. 345-350, (2006).

Schwarz et al., "Dependence of the growth rate, quality, and morphology of diamond coatings on the pressure during the DVD-process in an industrial hot-filament plant", Diamond Rel. Mater., vol. 11, pp. 589 (2002).

Synthesis, Properties, and Applications of Ultrananocrystalline Diamond (2005).

Wang et al., "The fabrication of nanocrystalline diamond films using hot filament CVD", Diamond Relat. Mater., vol. 13-1, pp. 6-13 (2004).

Xiao et al., "Low Temperature Growth of Ultrananocrystalline Diamond", J. Appl. Phys., vol. 96, pp. 2232 (2004).

Kim et al., "Novel Ultrananocrystalline Diamond Probes for High-Resolution Low-Wear Nanolithographic Techniques", Small, vol. 1, No. 8-9, pp. 866-874 (2005).

Scholz et al., "Fabrication of Monolithic Diamond probes for Scanning Probe Microscopy Applications", SPIE, vol. 3009, pp. 61-71 (1997).

PCT/US2008/069872 filed Jul. 11, 2008, Intl. Search Report and Written Opinion dated Oct. 14, 2008 (15 pages).

\* cited by examiner

Fig 1B. Wet Etch along <111> crystallographic plane

Fig 3A.
Pull-off Force

Fig 3B.
Tip Radius from Deconvolution

UNCD AFM Probe Fabrication Process — Fig 5A.

| Step | Image/Photo | Process | Description |
|---|---|---|---|
| 1 | | Oxidation, 0.3 μm | Wet oxide, 1000 oC, RCA clean first. |
| 2 | | Lithography, Mask 1 - tip molding holes | Priming, PR=S1813 @3000RPM, 30 min convection oven bake @ 90 oC, contact litho (or stepper), alignment within 1 o from flat, 4.5 s exp @25 mW/cm2, Dev. MIF 300 60s DP |
| 3 | | RIE Oxide etch | CHF3-O2, 50 sccm-2sccm, 40mTorr, 250W, ~24 min, remover. |
| 4 | | KOH etch of V-groves | KOH 50%, 80 oC, 21 min. |

UNCD AFM Probe Fabrication Process — Fig 5B.

| Step | Image/Photo | Process | Description |
|---|---|---|---|
| 5 | | Protect back side with PR and remove front side oxide | Bake 180oC 30 min, Spin coat S1818 @ 3000 RPM, 30s, Bake 30 min @90 oC convection oven; BOE 6:1, 16 min, remover. |
| 6 | | Oxidation sharpening ~ 1 μm | RCA clean, Wet oxide, 950 oC, 1 um. |
| 7 | | W sputtering, 10 nm | Ion beam clean 1 min, W target pre-sputter 2 min, P=23 mTorr, S0 sccm Ar, 2 kW (450 V), 0.6 min in CVC |
| 8 | | UNCD deposition at ADT | |

UNCD AFM Probe Fabrication Process — Fig 5C.

| Step | Image/Photo | Process | Description |
|---|---|---|---|
| 9 | | Sputter or PECVD Oxide deposition | 500 nm Oxide. [PECVD: 275 oC, 54sccm NO2-6 sccm SiH4, 450 mTorr, 44W, 7-8 min.] Prefere sputtering. |
| 10 | | Lithography Mask 5 – delineation of cantilevers | P10 primer, S1813, 3000 RPM, Contact aligner (EV620), Exp. 3.45 s @22 mW/cm2, Dev. MIF 300 1 min DP. |
| 11 | | RIE of oxide (CHF3-O2) and continued RIE of UNCD | CHF3-O2, 50 sccm-2sccm, 40mTorr, 200W, ~28 min; Diamond: O2-CF4, 25sccm-1sccm, 50 mTorr, 300W, |
| 12 | | CMP of oxide | "Touch polishing" SS12 slury (~20 s); PVA brush cleaning on Hamatech, back and front side. |

UNCD AFM Probe Fabrication Process — Fig 5D.

| Step | Image/Photo | Process | Description |
|---|---|---|---|
| 13 | | Back side lithography, M3 | Bake 180 oC 30 min, Spin coat S1818 @ 3000 RPM, 30s, Bake 30 min @90 oC convection oven; BOE 6:1, 24 min; Or: RIE CHF3-O2 (same as before), 42 min; remover. |
| 14 | | Dicing of Pyrex wafer, after protecting with PR; cleaning | Dice 350 um deep, with 1 index in x direction and 4 indexes in y direction (1.9mm, 4mm+0.3mm+0.3mm+0.3mm) |
| 15 | | Anodic bonding with alignment | Piranha clean (both Si wafer and Pyrex wafer); Alignment (EV620); Bonding EV501 (400 oC, 1200 V, 140 N, ~10 min) |

UNCD AFM Probe Fabrication Process — Fig 5E.

| Step | Image/Photo | Process | Description |
|---|---|---|---|
| 16 | | Dicing of Pyrex to delineate chips | 250 um deep, with 1 index in x direction and 4 indexes in y direction (1.9mm, 4mm+0.35mm+0.35mm+0.35mm+0.35mm). NOTE: the dies remain attached along the long side. |
| 17 | | Back side etching of Si in KOH | KOH 30% @80 oC, w back side protective holder. |
| 18 | | Etching of oxide in BOE and etch of W and WC | BOE 6:1, followed by 2x(KOH 10 g+k-ferocyanide 10g+100ml H2O, 10 min & (HCl 37% 3 Vol+ HNO3 97% 1 Vol, 10 min); rinsing DI water & Methanol & gentle dri blow. |

DIAMOND FILM DEPOSITION AND PROBES

RELATED APPLICATIONS

This application claims priority to U.S. provisional application 60/929,808 filed Jul. 13, 2007, which is hereby incorporated by reference in its entirety.

BACKGROUND

Diamond is an important luxury and industrial material which nature provides and also now can be made synthetically. Whether it is natural or synthetic, diamond is actually a family of materials, and some forms of diamond are more useful than other forms for particular applications as the properties of the different forms vary. Types of diamond known in the art include, for example, microcrystalline diamond (MCD), nanocrystalline diamond (UNCD), and ultrananocrystalline diamond (UNCD). Diamond can comprise a plurality of individual grains of diamond, and the size of the grains can vary. In many cases, it is desirable to control the form or the morphology of the diamond down to smaller and smaller scales, including down to the nanoscale, so as to obtain the best properties. Diamond can be an expensive material, and the cost of different diamond forms can vary. Hence, for commercialization, it is important to better understand how to synthesize diamond with better properties and cost-benefits under commercially realistic conditions. For example, one important commercial application is in the area of MEMs and components such as scanning probe microscopes and atomic force microscopes which require use of hard, durable tips. See, for example, *Synthesis, Properties, and Applications of Ultrananocrystalline Diamond*, 2005; *Handbook of Industrial Diamonds and Diamond Films*, 1998.

One method to make diamond is chemical vapor deposition (CVD). In this method, a chemical vapor can be reacted over a solid surface, and the result is the formation or deposition of a material on the solid surface. For example, one can react in a CVD reaction chamber multiple components including for example (i) a compound comprising carbon with (ii) hydrogen gas to form diamond on a solid surface. Or one can react a compound comprising carbon in the presence of a noble gas to form diamond on a solid surface. One can use a hot surface or plasmas to activate reaction. In recent years, much interest has arisen in use of noble gases in the diamond deposition because the type of diamond made from these processes, sometimes called ultrananocrystalline diamond (UNCD), can provide advantages including very smooth as-deposited surfaces, high hardness, have small particle grain sizes, low deposition temperatures, the ability to pattern to nanoscale resolution including use of self-aligned deposition, and other useful properties. Useful properties can be, for example, mechanical, tribological, transport, electrochemical, or electron emission in nature. See, for example, U.S. Pat. No. 7,128,889 (Carlisle et al.) and U.S. Pat. No. 5,849,079 and publication no. 2005/0031785 (Carlisle et al).

However, while CVD can be a successful method for research in diamond science, commercial production can provide demands which are not addressed by academic research. For example, in commercial fabrication, one may need to form the diamond in a shape such as a sharp tip, for example. Therefore, despite these advances, a need exists to develop methods of synthetic diamond production for commercial applications, including UNCD production, which are more amenable to, for example, deposition into shaped surfaces, deposition over larger surface areas, use of multiple substrates and shaped surfaces, faster deposition rates, deposition with good uniformity, and deposition at lower temperatures.

SUMMARY

Embodiments described herein include articles and devices, as well as methods of making, methods of using.

One embodiment, for example, provides a method comprising: providing a substrate, wherein the substrate has a depression adapted to form a scanning probe tip; depositing a refractory metal layer disposed on the depression in the substrate; depositing seed crystals on the refractory metal layer; depositing diamond on the seed crystals to form the scanning probe tip; and separating the scanning probe tip from the depression in the substrate. The refractory metal layer can comprise or consist essentially of tungsten.

Another embodiment provides a scanning probe tip comprising: a pyramid-shaped, 4-pointed tip with a radius between about 2 nm and about 20 nm; wherein the pyramid-shaped, 4-pointed tip comprises deposited ultrananocrystalline diamond.

Another embodiment provides a method comprising:
providing a <100> silicon substrate in a chamber, wherein the single crystal silicon substrate substrate has a depression adapted to form a scanning probe tip for microscopy;

wet etching the single crystal silicon substrate along the <111> plane with an anisotropic wet etch to fabricate the depression in the form of an inverted pyramid-shaped opening with a 4-pointed scanning probe tip;

sharpening the 4-pointed scanning probe tip by growing silicon dioxide on the sidewalls of the pyramid-shaped opening of the single crystal silicon substrate;

depositing via atomic layer deposition (ALD) 1 nm of aluminum oxide ($Al_2O_3$) on the sidewalls of the inverted pyramid-shaped opening in the single crystal silicon substrate;

depositing a tungsten layer disposed on the sidewalls of the inverted pyramid-shaped opening in the single crystal substrate via radio frequency (RF) sputtering with an argon gas flow rate of about 30 sccm, and RF power of about 150 W at room temperature;

depositing a seed layer comprising, for example, nanocrystalline diamond particles from an organic ultrasonic bath onto the tungsten layer, wherein the nanocrystalline diamond particles have average grain sizes between about 10 nm and about 100 nm and in a nucleation density between about $10^{10}$ sites/$cm^2$ and $10^{12}$ sites/$cm^2$.

One or more advantages for one or more embodiments include for example sharp probes including SPM and AFM probes which are durable, high resolution and chemically resistant.

DETAILED DESCRIPTION

Introduction
References cited herein are hereby incorporated by reference in their entirety.

Priority to U.S. provisional application 60/929,808 filed Jul. 13, 2007 is hereby incorporated by reference in its entirety.

The following references, and other references cited herein, can be used as needed in practice of the various embodiments described herein:

May et al. "Reevaluation of the mechanism for ultrananocrystalline diamond deposition from Ar/CH4/H2 gas mixtures", *Journal of Applied Physics*, 99, 104907 (2006);

May et al. "Experiment and modeling of the deposition of ultrananocrystalline diamond films using hot filament chemical vapor deposition and Ar/CH4/H2 gas mixtures: A generalized mechanism for ultrananocrystalline diamond growth." *J. Applied Phys.*, 100, 024301 (2006).

May et al. "Microcrystalline, nanocrystalline and ultrananocrystalline diamond chemical vapor deposition: Experiment and modeling of the factors controlling growth rate, nucleation and crystal size", *Journal of Applied Physics*, 101, 053115 (2007);

Gruen, "Nanocrystalline Diamond Films," Annu. Rev. Mater. Sci., 29 (1999) 211.

Wang et al., "The fabrication of nanocrystalline diamond films using hot filament CVD", *Diamond Relat. Mater.*, 13-1, 6-13 (2004);

Xiao et al., "Low Temperature Growth of Ultrananocrystalline Diamond", *Journal of Applied Physics*, 96, 2232 (2004);

Carlisle et al., "Characterization of nanocrystalline diamond films by core-level photoabsorption", *Appl. Phys. Lett.* 68, 1640 (1996);

Schwarz, et al., "Dependence of the growth rate, quality, and morphology of diamond coatings on the pressure during the CVD-process in an industrial hot-filament plant", *Diamond Rel. Materials.*, 11, 589 (2002);

James Birrell et al., Morphology and Electronic Structure of Nitrogen-doped Ultrananocrystalline Diamond *Appl. Phys. Lett.* 81, 2235 (2002);

Birrell et al., *Interpretation of the Raman Spectra of Ultrananocrystalline Diamond*, Diamond & Relat. Mater. 14, 86 (2005);

Naquib et al., "Enhanced Nucleation, Smoothness and Conformality of Ultrananocrystalline Diamond (UNCD) Ultrathin Films Via Tungsten Interlayers," *Chemical Physics Letters*, v. 430, iss. 4-6, p. 345-350;

Espinosa et al., Mechanical Properties of Ultrananocrystalline Diamond Thin Films Relevant to MEMS Devices, *Exper. Mech.* 43, (3), 256-268 (2003);

Angadi et al., "*Thermal Transport and Grain Boundary Conductance in Ultrananocrystalline Diamond Thin Films*", Journal of Applied Physics, 99, 114301 (2006);

| 5,066,358 A | November 1991 | Quate et al. | 156/647 |
| 5,221,415 A | June 1993 | Albrecht et al. | 156/629 |
| 5,994,160 A | November 1999 | Niedermann et al. | 438/53 |

Process Overview

FIGS. 1A-1E and also FIGS. 5A-E illustrate an embodiment for fabrication. Other embodiments are described herein below, which are not limited by FIGS. 1A-1E and FIGS. 5A-E.

Substrate

The substrate can be a variety of solid substrates. For example, they can be smooth substrates. A substrate may be a solid material either single crystal or polycrystalline. It can be a semiconductor material such as silicon. It can be an inorganic material. It can monolithic or multi-layered. The surface of the substrate can be modified to facilitate deposition.

Figure 1A:
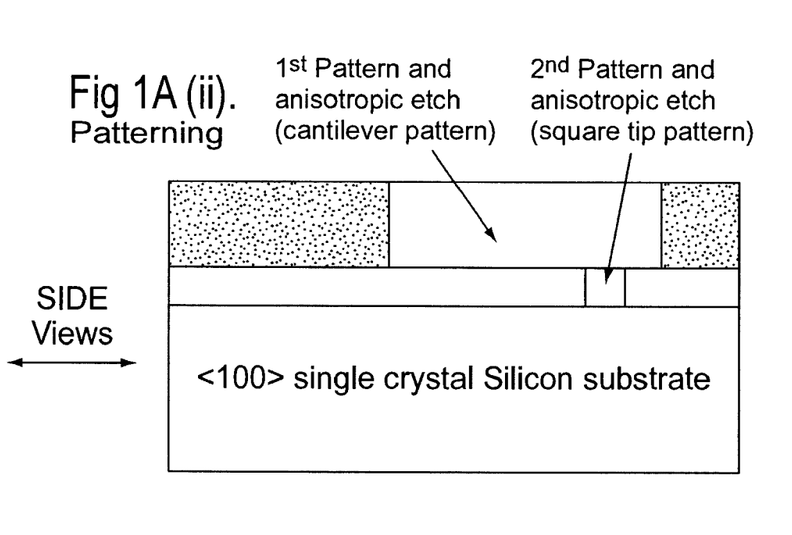
FIGS. 1A-1E illustrate microfabrication of the probes.

One embodiment is shown in FIG. 1A (i) which illustrates a substrate and mask structure for fabricating the scanning tip probe, cantilever and connecting base. The substrate can typically be a <100> single crystal, semiconductor grade silicon wafer. The depression in this substrate can be made while the remainder of the substrate can be protected by masks, sacrificial mask layer 1 and sacrificial mask layer 2. Masking materials include solids that can be selectively removed by etching. A masking material can be typically silicon dioxide and/or silicon nitride. The sacrificial mask layers may be typically deposited on the substrate.

As shown in FIG. 1A (ii), a first pattern can be created in sacrificial mask layer 2 by anisotropic etching. Selective etching of mask structures to create a tip combined with a lever is discussed in Albrecht et al., U.S. Pat. No. 5,221,415 and Niedermann et al., U.S. Pat. No. 5,994,160, which are both hereby incorporated by reference in their entirety. The space created by removing the material in sacrificial mask layer 2 can be used for depositing a cantilever that is attached to the scanning probe tip. The cantilever can be made in various shapes, such as rectangular and "V"-shaped.

A second pattern can also be created in sacrificial mask layer 1 by anisotropic etching. The space created by removing the material in sacrificial mask layer 1 can be used for depositing a base connecting the cantilever to the scanning probe tip. It is preferable to use a square shape for this base rather than a rectangular pattern because the depression resulting from etching a rectangular opening will give rise to a knife edge, undesirable for a scanning probe tip.

Depression Adapted to Form a Scanning Probe Tip

The substrate surface can comprise one or more depressions which are adapted in shape to provide for fabrication of SPM and AFM probes. The substrate can comprise a plurality of depressions to make arrays.

Figure 1B:
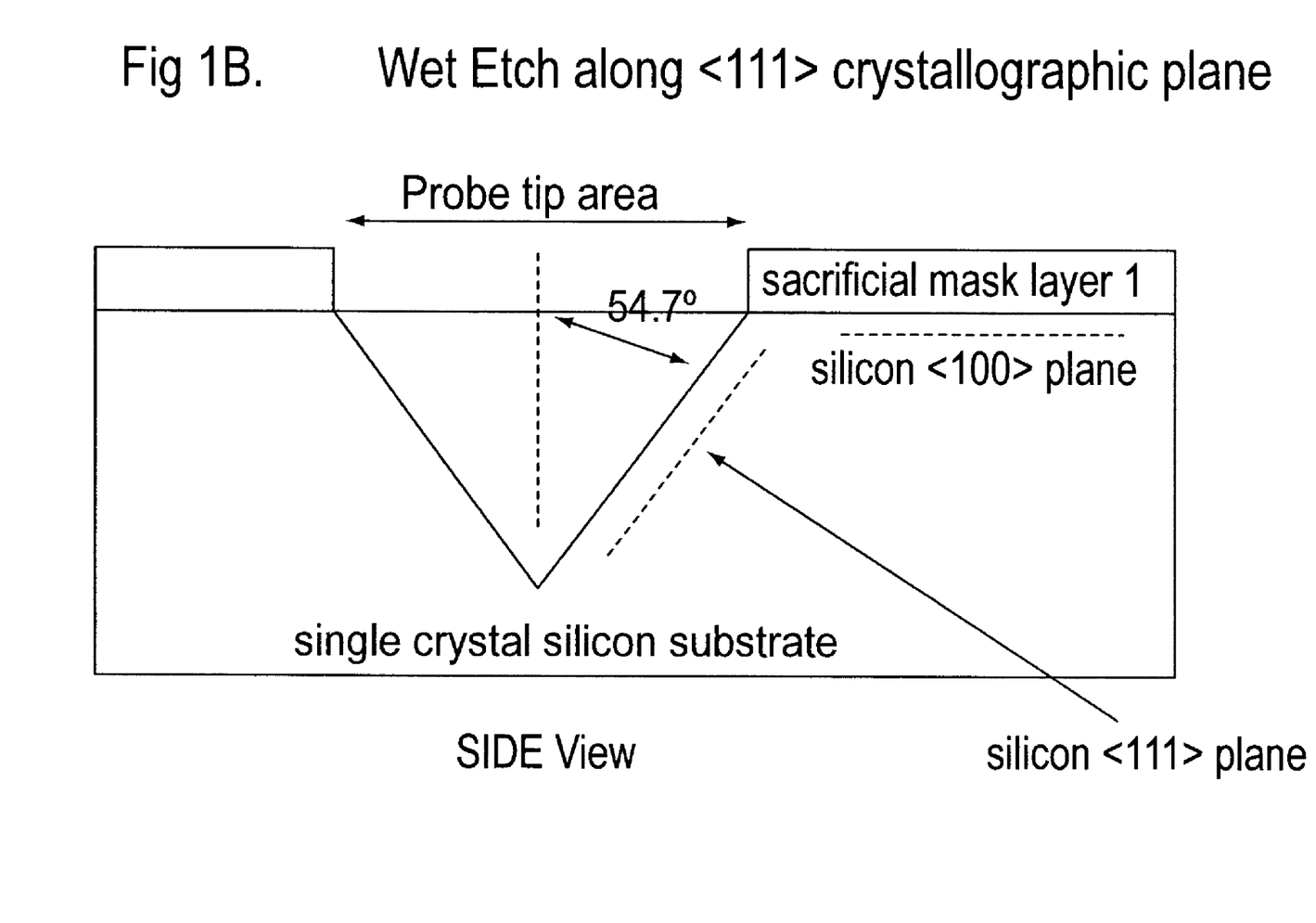

For example, FIG. 1B illustrates a depression etched with a square opening in sacrificial mask layer 1. The depression can be created by wet etching preferentially along crystallographic planes. If <100> plane single crystal silicon is used, the <111> plane will be opened up. If an exact square opening is etched with an anisotropic wet etch, such as potassium hydroxide (KOH) or ethylenediamine/pyrcatechol (i.e. benzene diol)/water, then an inverted pyramid-shaped opening or "mold" will be etched to a sharp 4-pointed tip.

Scanning Probe Tip Sharpening

Figure 1C:
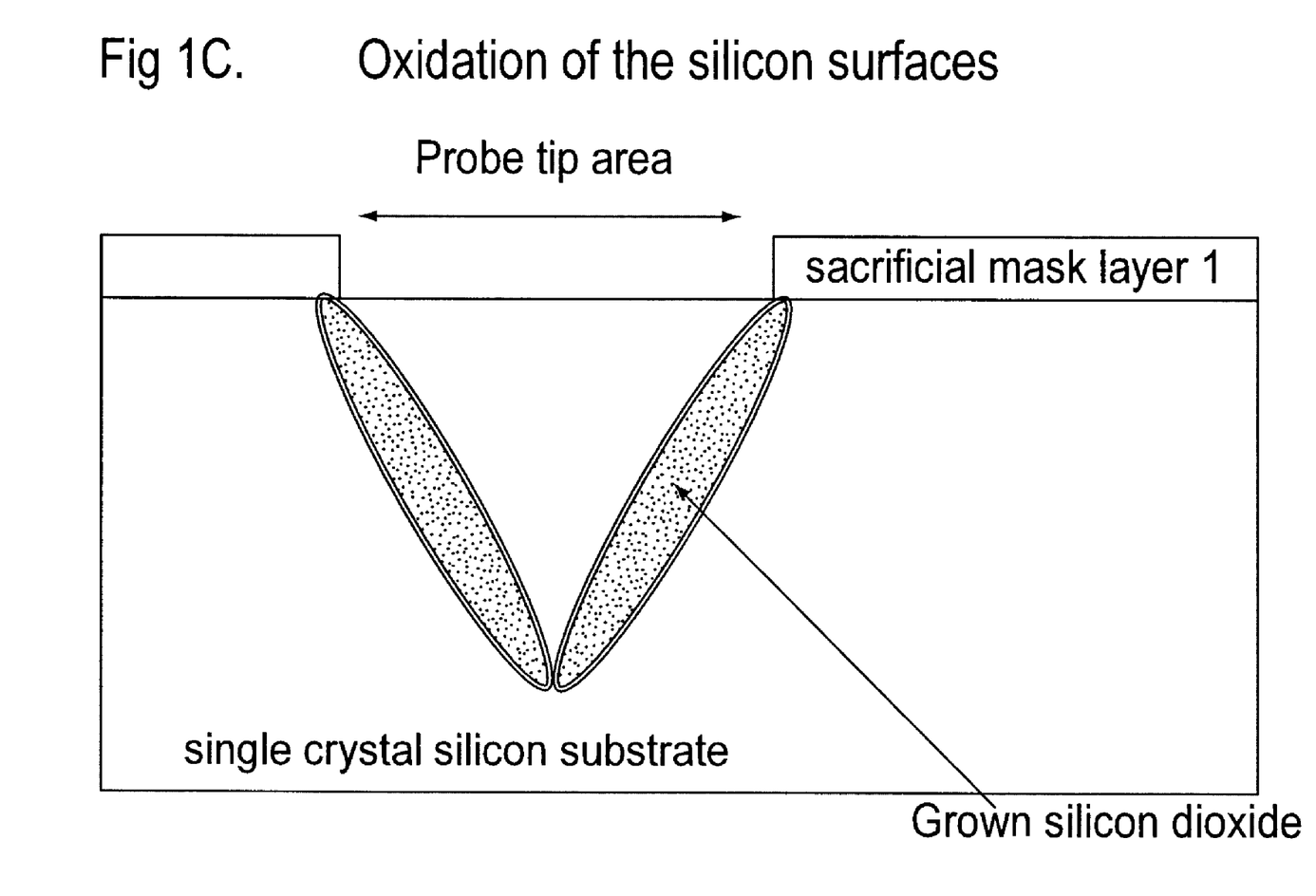

Methods known in the art and as described herein can be used for tip sharpening. For example, the sharp 4-pointed tip at the bottom of the inverted pyramid-shaped opening can be further sharpened to create a tip of nanometer dimensions. FIG. 1C depicts oxidation resulting in an oxide layer on the sidewalls of the sharp 4-pointed tip. The open tip area of the sidewalls can be oxidized to form silicon dioxide. The silicon oxide thickness is about 2.17 times greater than the silicon than it replaces. Thus, the oxidation along the sidewalls is greater than that at the tip because there is more silicon available and volume to expand on the sidewalls than at the tip. The resulting effect of the oxidation is to sharpen the tip beyond the sharpness of the crystallographic etch point as indicated by the grown silicon dioxide shown in FIG. 1C. This sharpening technique is described in Quate et al., U.S. Pat. No. 5,066,358, which is hereby incorporated by reference in its entirety.

Refractory Layer

Metal layers and transition metal layers can be used. For example, a refractory metal layer can be used to improve deposition. For example, titanium, zirconium, hafnium, vanadium, nickel, tantalum, molybdenum, chromium, and tungsten can be used. In particular, tungsten can be used effectively. The layer can comprise or consist essentially of refractory metal, including tungsten.

Figure 1D:
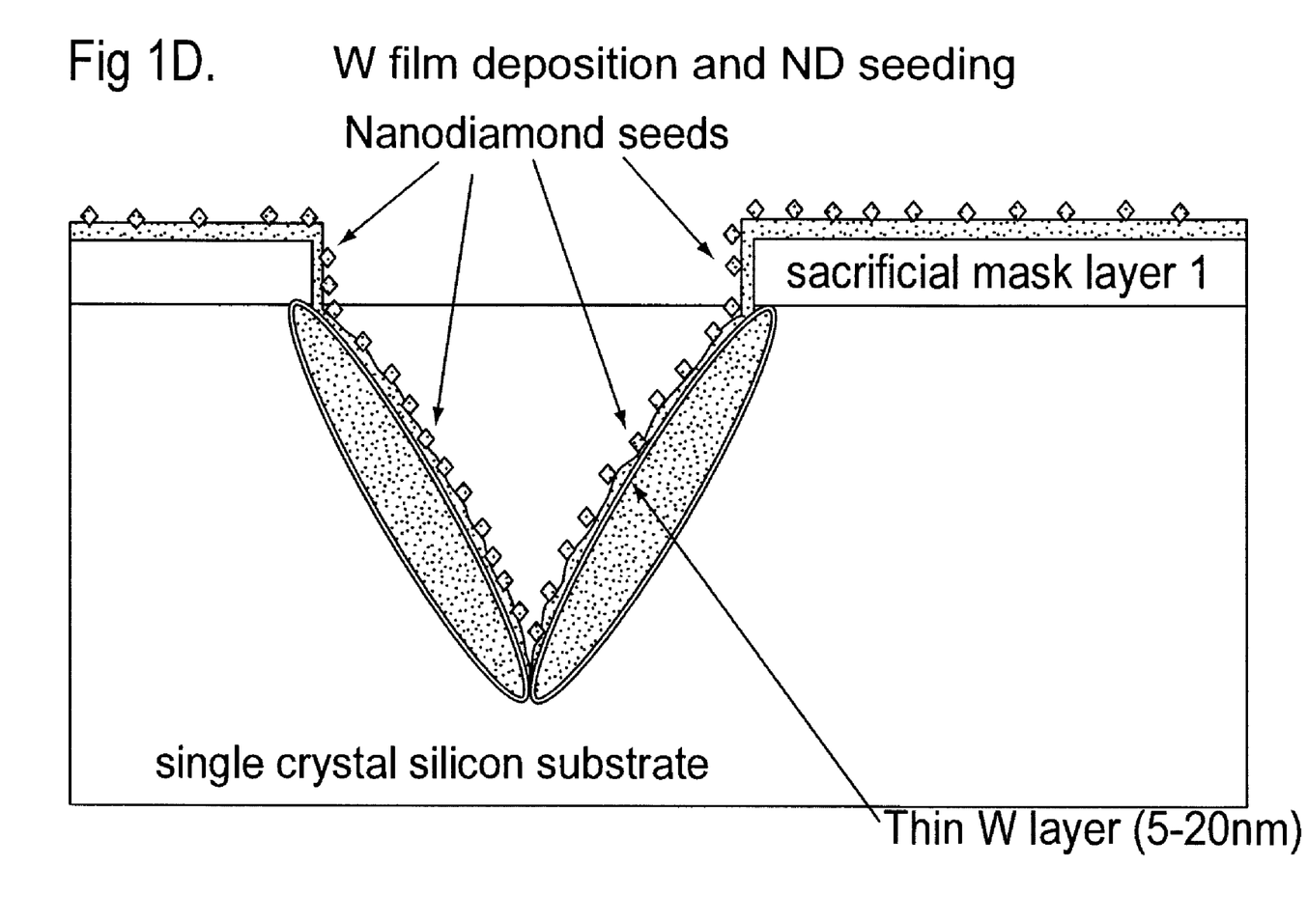

For example, FIG. 1D illustrates depositing layers via atomic layer deposition (ALD) after sharpening the scanning probe tip. First, about 1 nm aluminum oxide can be deposited by ALD on the silicon oxide layer on the sidewalls and on the masks to improve nucleation of tungsten (W). Then, the tungsten films can be deposited in at least two ways. Naguib et al., "Enhanced Nucleation, Smoothness and Conformality of Ultrananocrystalline Diamond (UNCD) Ultrathin Films Via Tungsten Interlayers," discloses radio frequency (RF) magnetron sputtering and atomic layer deposition of tungsten films. RF magnetron sputtering of tungsten can involve conditions of an argon gas flow rate of about 30 sccm, RF power of about 150 W at room temperature. Atomic layer deposition of tungsten can be performed with tungsten hexafluoride ($WF_6$) and disilane ($Si_2H_6$) vapors alternately pulsed. As shown in FIG. 1D, the resulting tungsten layer can be for example between about 5 nm and about 20 nm in thickness.

Seed Layer/Crystals

In addition, for example, FIG. 1D additionally shows the deposition of nanocrystalline diamond. Grains of nanocrystalline diamond of sizes between about 10 nm and about 200 nm are deposited from an organic ultrasonic bath onto the tungsten layer. The deposited nanocrystalline diamond seeds form a seed layer with a nucleation density between about $10^{10}$ sites/cm$^2$ and about $10^{12}$ sites/cm$^2$. Alternatively, ultradispersed diamond (UDD) can be used to form a seed layer with comparable nucleation density. The seed layer preferably comprises diamond crystals.

Diamond Deposition

Figure 1E:
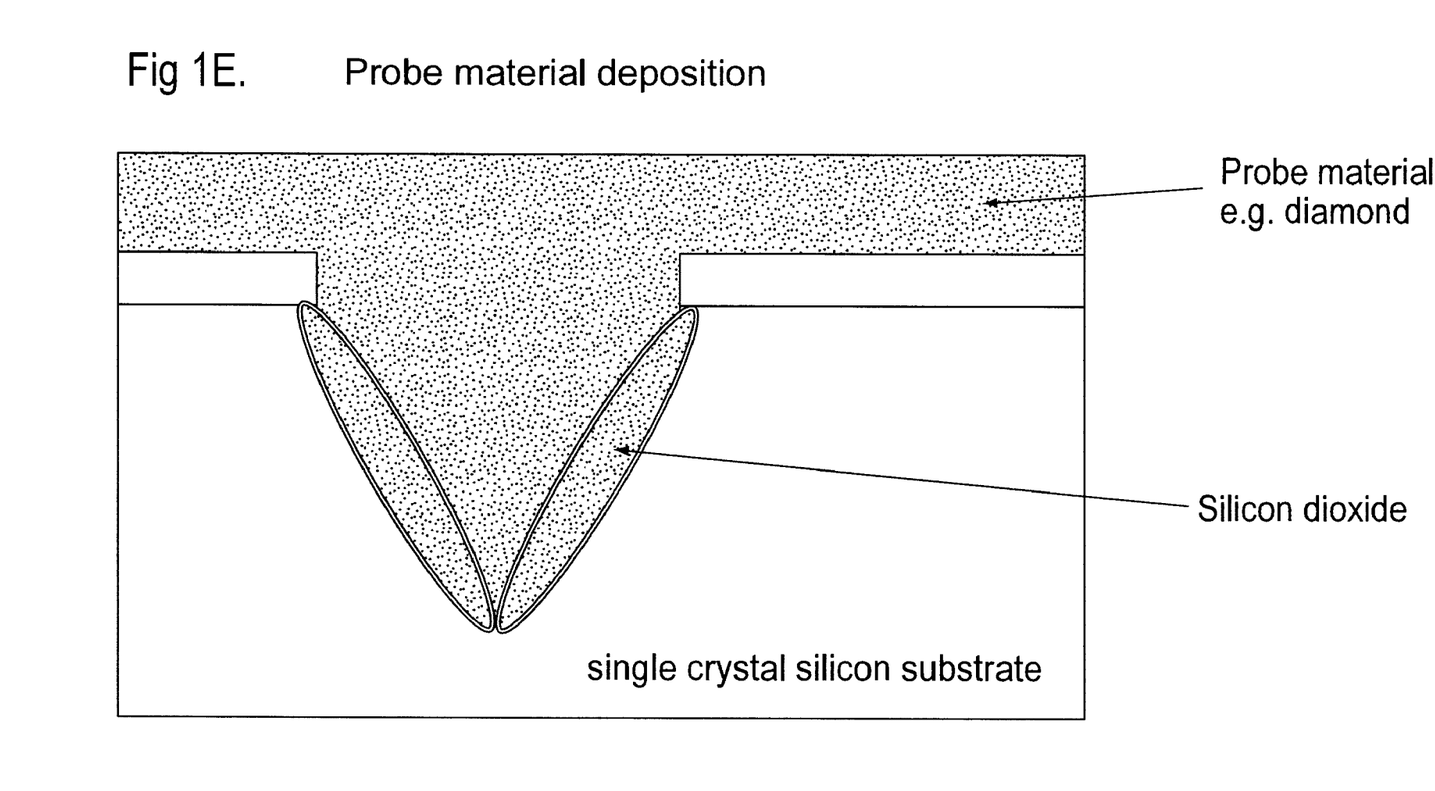

Diamond can be nanocrystalline or ultrananocrystalline. Diamond deposition can be carried out by methods described in the references cited herein, including the introduction section, and also by methods described in U.S. patent application Ser. No. 11/775,846 to Carlisle et al., which is hereby incorporated by reference in its entirety. FIG. 1E, illustrates diamond material deposited on the silicon substrate.

The nanocrystalline or ultrananocrystalline diamond (UNCD) can be deposited by microwave plasma desposition or hot filament chemical vapor deposition. Microwave plasma deposition may be performed under conditions of an argon gas flow rate of about 49.2 sccm, a methane gas flow rate of about 0.8 sccm, a pressure of about 200 mbar, a substrate temperature of about 800° C., a microwave power of about 1200 W and a deposition time of about 20 minutes. Alternatively, hot filament chemical vapor deposition can be performed under conditions of a vapor comprising methane ($CH_4$) and hydrogen ($H_2$), wherein the vapor is substantially free of noble and inert gas. The ultrananocrystalline diamond may be deposited during a reaction with the vapor in a hot filament chemical vapor deposition reaction chamber at a pressure less than about 10 torr and a filament temperature of at least about 2,350° C. The ultrananocrystalline diamond comprises grains of an average size between about 2 nm and about 5 nm.

Separation of Tip and Substrate

The scanning probe tip can be separated from the silicon dioxide layer grown on the single crystal silicon substrate by etching using, for example, etchants buffered hydrofluoric acid.

Tips

In particular, AFM tips can be made. The height of the tip can be varied for an application. Arrays of tips can be made.

Characterization of Diamond

Figure 2A:
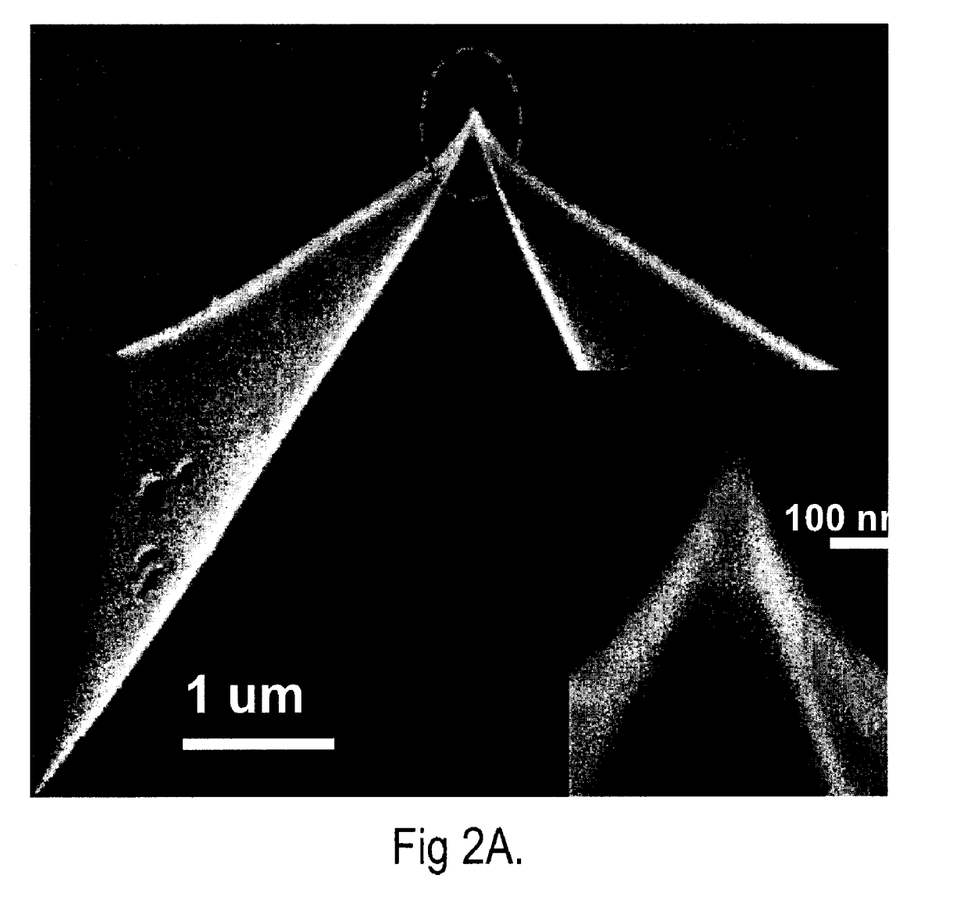
FIGS. 2A-2B illustrate SEM analysis of the probes.
Figure 2B:
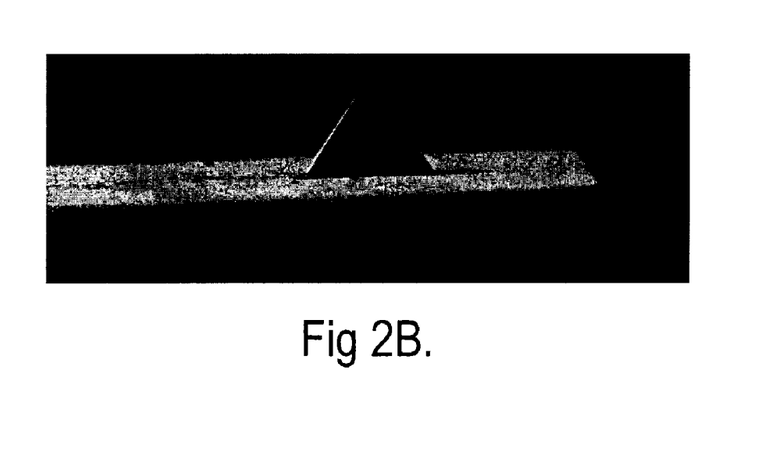

Methods known in the art can be used to characterize the diamond and the tip. For example, FIG. 2A, depicts a scanning electron microscope (SEM) image of the tip of the scanning probe. The effective radius of the probe is about 10 nm. The sides of the pyramid bow in as a result of grown silicon oxide on the sidewalls of the depression. FIG. 2B (side view) shows the scanning probe tip on the cantilever.

Additional Embodiments

The SPM and AFM tips can be polished by methods known in the art so that the diamond surface can be made more smooth.

Applications

Applications include both imaging and fabrication including for example dip pen nanolithography and related methods. Imaging hard surfaces such as diamond is a particularly important application.

Working Examples

Figure 3A:
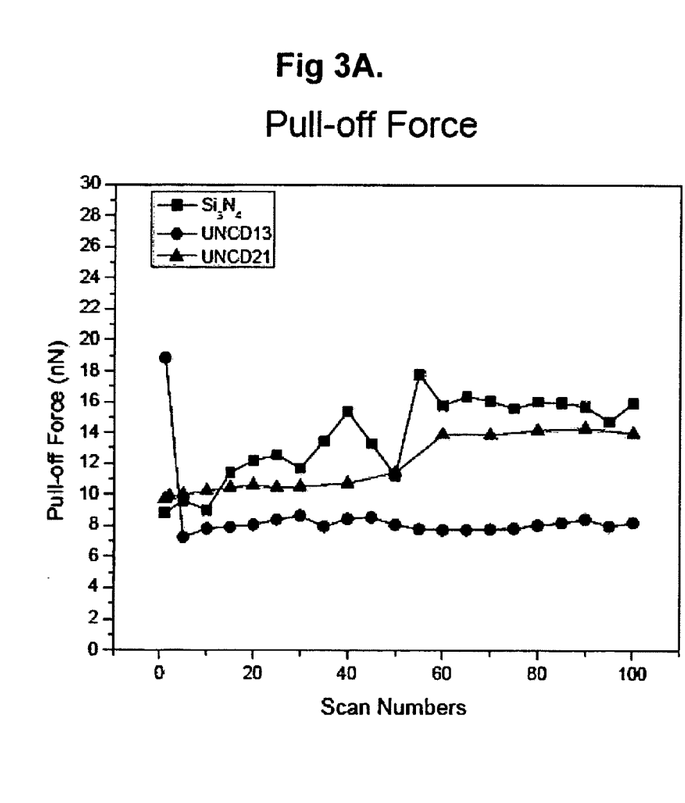
FIGS. 3A-3B illustrate probe performance as a function of scan number.
Figure 3B:
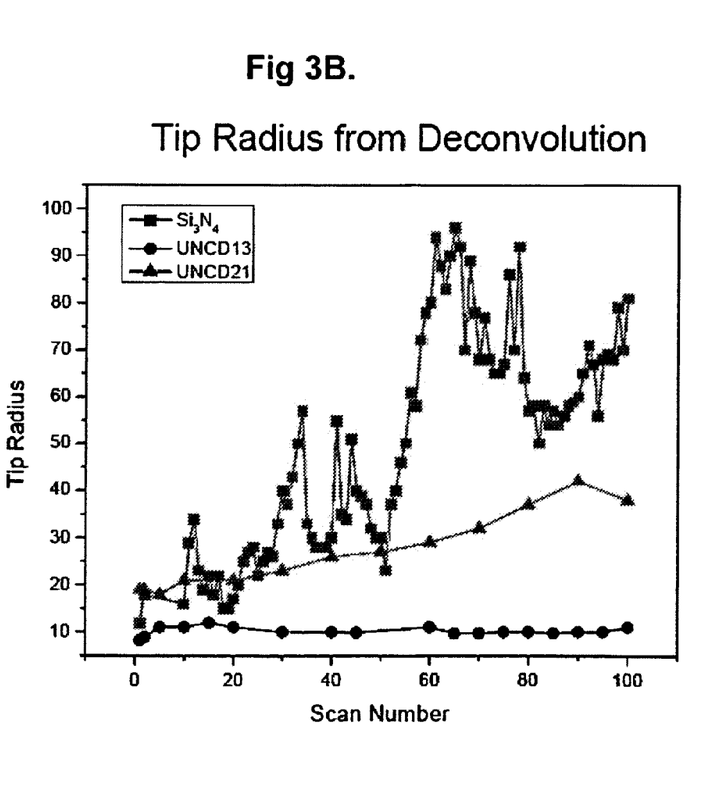

FIG. 3A illustrates the pull-off force for various tips over several scans. Compared with tip fabricated out of silicon nitride ($Si_3N_4$), the diamond tip has a more consistent pull-off force over several scans. FIG. 3B shows that the diamond tip maintains its size over several scans compared with the silicon nitride tip.

Figure 4A:
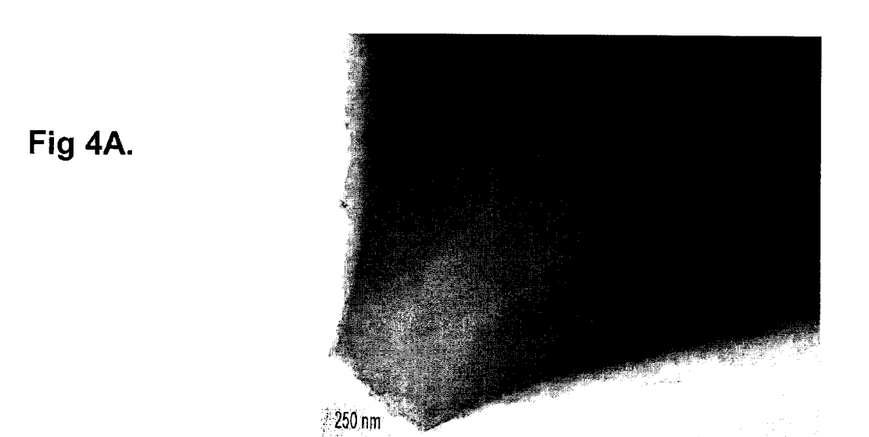
FIGS. 4A-4B illustrate TEM and SEM images (respectively) of AFM probes made with poor seeding processes.
Figure 4B:
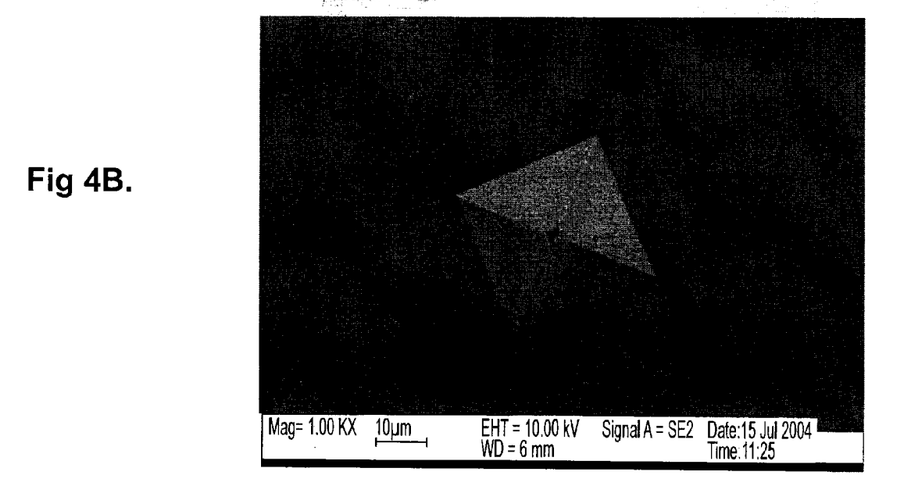
Figure 5A:
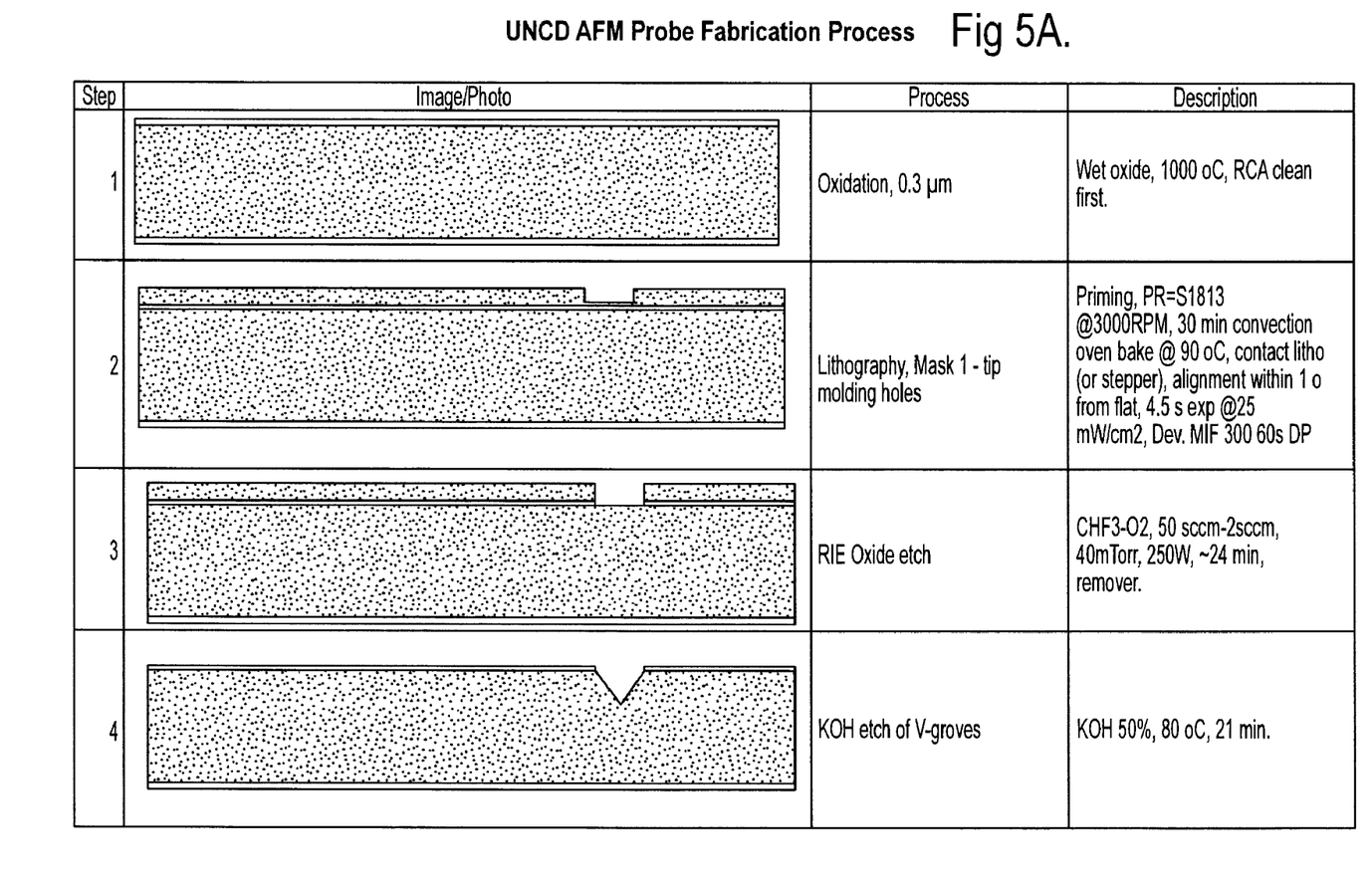
FIGS. 5A-E illustrate an additional summary of a process of fabrication.
Figure 5B:
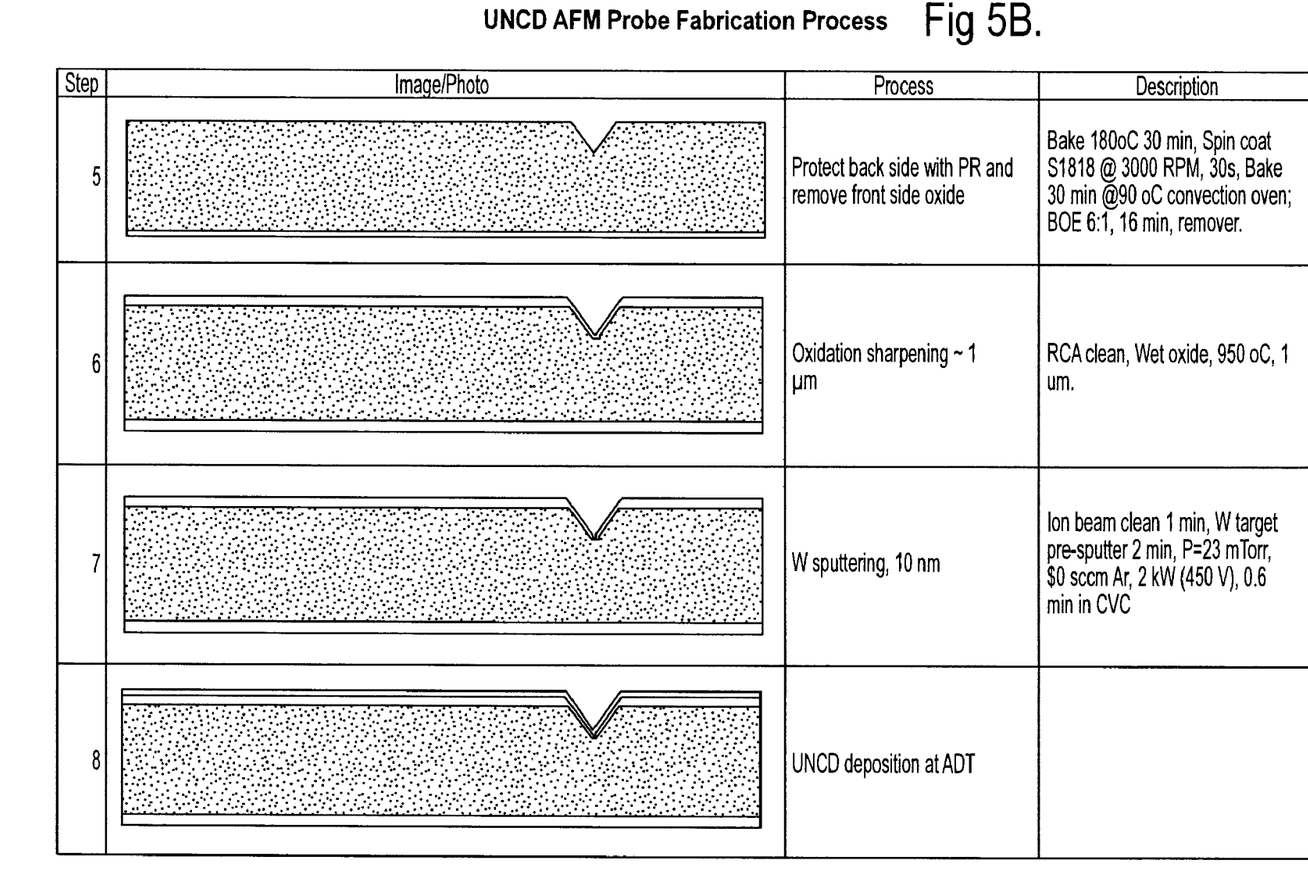
Figure 5C:
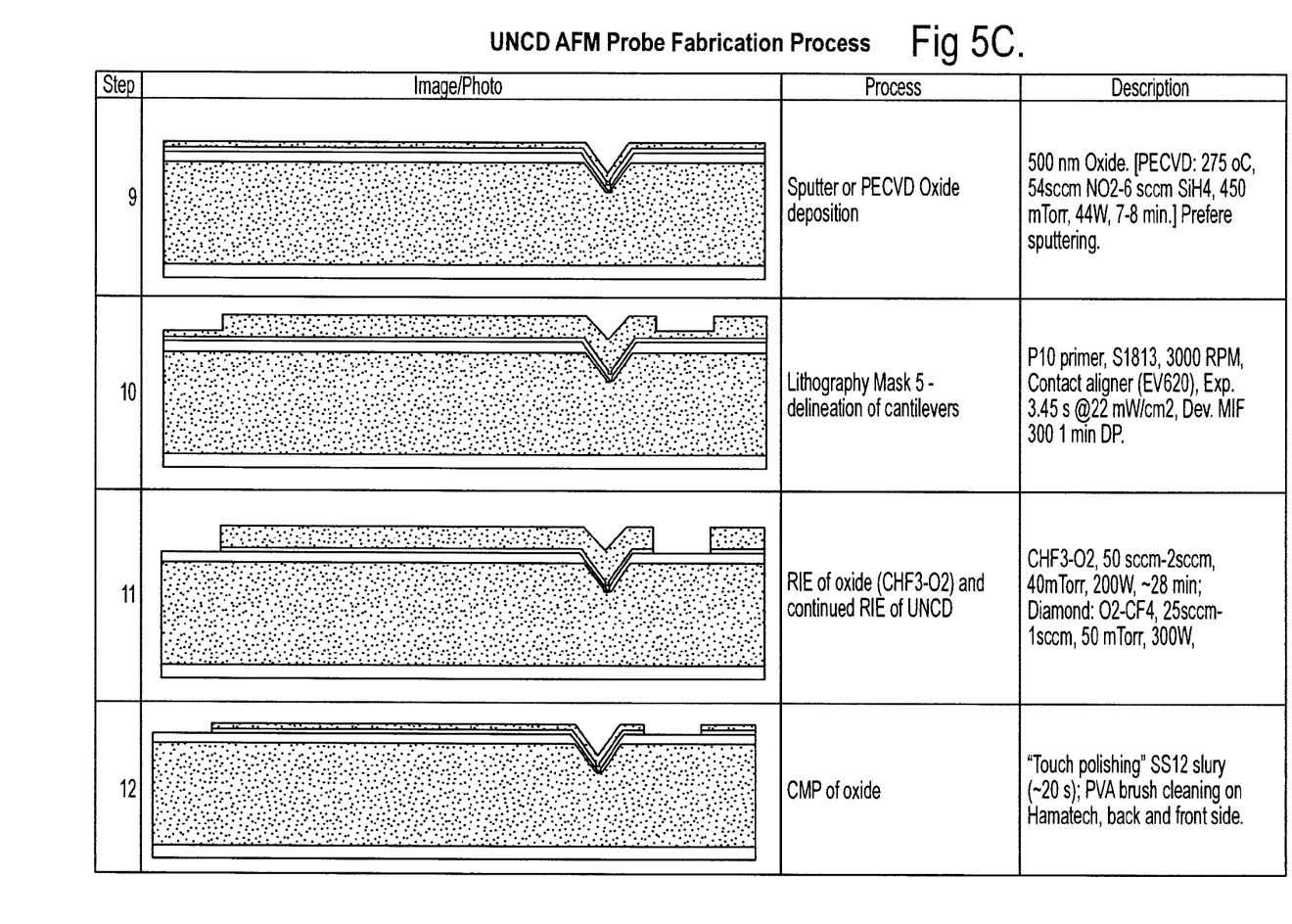
Figure 5D:
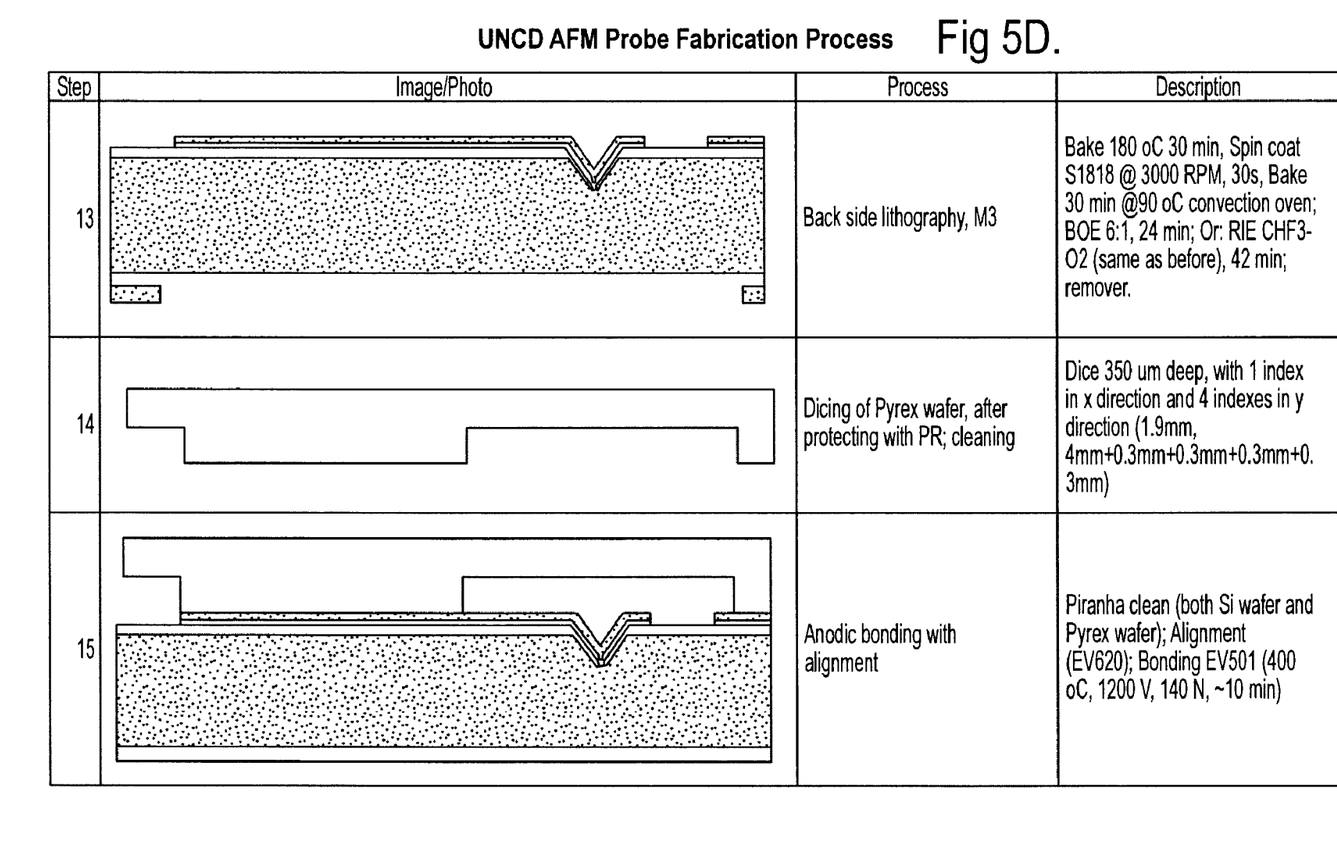
Figure 5E:
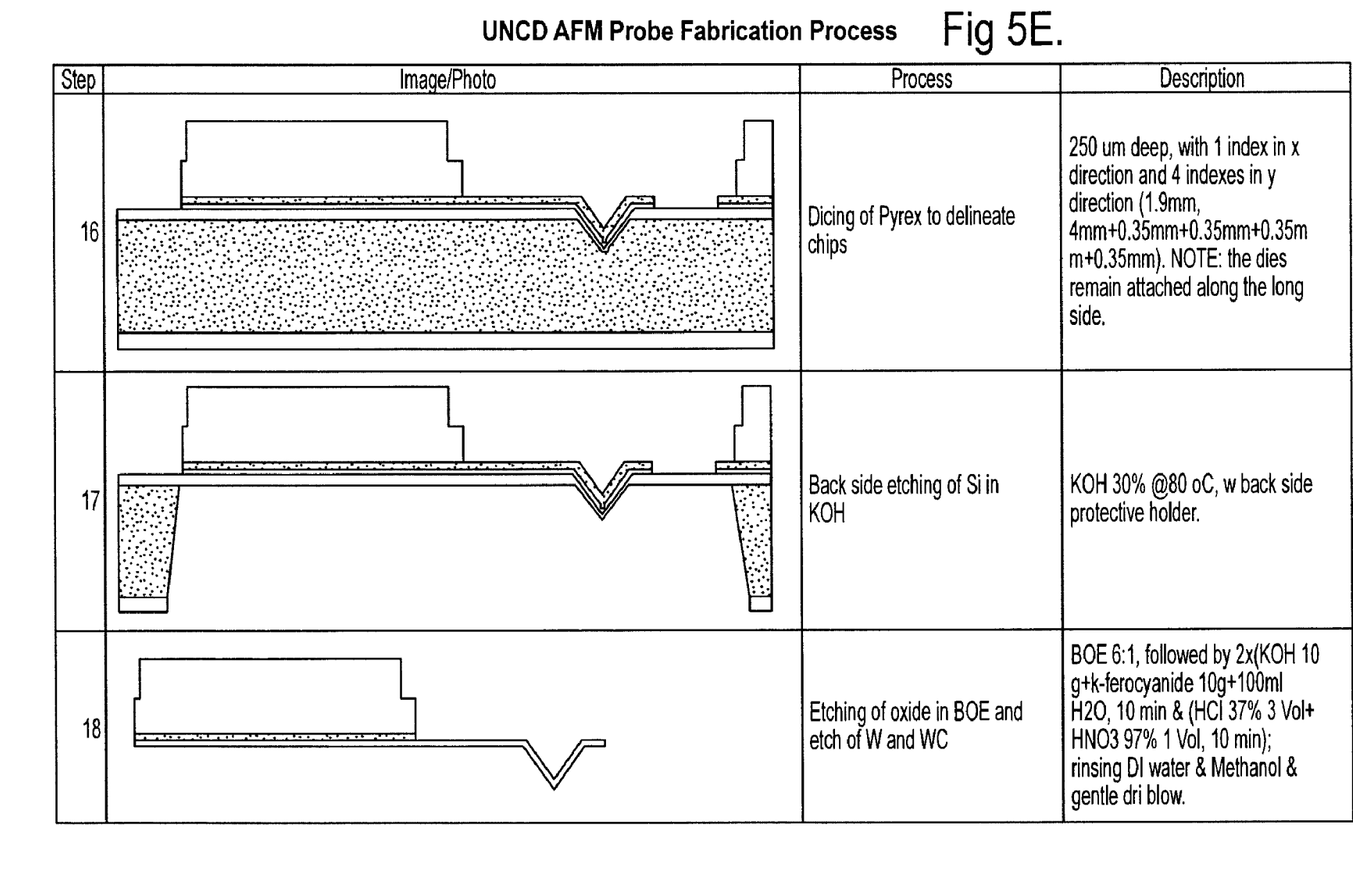

FIGS. 4A and 4B illustrate a tip fabricated without tungsten seeding. As shown, the tip has broken off resulting in the poor bonding of the diamond to the sidewalls of the depression in the silicon substrate.

What is claimed is:

1. A method comprising:
   providing a substrate, wherein the substrate has a depression adapted to form a scanning probe tip;
   depositing a refractory metal layer disposed on the depression in the substrate;
   depositing seed crystals on the refractory metal layer;
   depositing diamond on the seed crystals to form the scanning probe tip; and
   separating the scanning probe tip from the depression in the substrate, wherein the substrate comprises silicon.

2. The method of claim 1, wherein the step of providing a substrate comprises:
   forming a depression by fabricating a pyramid-shaped opening; and
   sharpening the pyramid-shaped opening to form a sharp 4-pointed, scanning probe tip.

3. The method of claim 1, wherein the substrate comprises <100> silicon.

4. The method of claim 3, wherein the step of providing the single crystal silicon substrate comprises:
   wet etching the single crystal silicon substrate along the <111> plane with an anisotropic wet etch to fabricate the depression in the form of an inverted pyramid-shaped opening with a 4-pointed scanning probe tip.

5. The method of claim 4, wherein the wet etch comprises any of potassium hydroxide (KOH) and ethylenediamine/pyrcatechol/water.

6. The method of claim 4, further comprising:
   sharpening the 4-pointed scanning probe tip by oxidizing the silicon on the sidewalls of the inverted pyramid-shaped opening of the single crystal silicon substrate to grow silicon dioxide.

7. The method of claim 1, wherein the step of depositing the refractory metal layer comprises:

radio frequency (RF) sputtering tungsten with an argon gas flow rate of about 30 sccm, and RF power of about 150 W at room temperature.

8. The method of claim 4, wherein the step of depositing the refractory metal layer comprises:

depositing via atomic layer deposition (ALD) aluminum oxide ($Al_2O_3$) of a thickness of about 1 nm on the sidewalls of the pyramid-shaped opening of the single crystal silicon substrate; and depositing tungsten via ALD on the sidewalls, wherein tungsten hexafluoride ($WF_6$) and disilane ($Si_2H_6$) vapors were alternately pulsed.

9. The method of claim 4, wherein the step of depositing seed crystals comprises depositing a seed layer comprising nanocrystalline diamond seeds from an organic ultrasonic bath onto the tungsten layer.

10. The method of claim 9, wherein the nanocrystalline diamond seeds have grain sizes between about 10 nm and about 200 nm.

11. The method of claim 9, where in the deposited seed layer comprises nanocrystalline diamond seeds in a nucleation density between about $10^{10}$ sites/cm$^2$ and about $10^{12}$ sites/cm$^2$.

12. The method of claim 8, wherein the deposited layer of tungsten is from about 5 nm to about 20 nm in thickness.

13. The method of claim 1, wherein the step of depositing diamond on the seed crystals to form a scanning probe tip comprises:

depositing ultrananocrystalline diamond on the seed crystals from a microwave plasma system under conditions of:

an argon gas flow rate of about 49.2 sccm;

a methane gas flow rate of about 0.8 sccm;

a pressure of about 200 mbar;

a substrate temperature of about 800° C.;

a microwave power of about 1200 W; and a deposition time of about 20 minutes.

14. The method of claim 13, wherein the ultrananocrystalline diamond comprises grains of an average size between about 2 nm and about 20 nm.

15. The method of claim 1, wherein the step of depositing diamond on the seed crystals to form a scanning probe tip comprises:

providing at least one hot filament chemical vapor deposition reaction chamber;

providing at least one vapor to the reaction chamber, wherein the vapor provided to the reaction chamber comprises methane ($CH_4$) and hydrogen ($H_2$), wherein the vapor is substantially free of noble and inert gas;

depositing ultrananocrystalline diamond on the seed crystals during a reaction with the vapor in the reaction chamber at a pressure less than about 10 torr, and a filament temperature of at least about 2,350° C.

16. The method of claim 15, wherein the ultrananocrystalline diamond comprises grains of an average size between about 2 nm and about 10 nm.

17. The method of claim 1, wherein the seed crystals are formed by depositing ultradispersed diamond (UDD).

18. The method of claim 1, wherein the step of separating the scanning probe tip from the depression in the substrate comprises:

etching material underneath the scanning probe tip on the depression in the substrate.

19. The method of claim 1 further comprising:

forming a cantilever over the formed scanning probe tip.

20. The method of claim 19, wherein the cantilever comprises nickel (Ni).

21. The method of claim 19, wherein the cantilever comprises diamond.

22. A method comprising:

providing a <100> silicon substrate in a chamber, wherein the <100> silicon substrate has a depression adapted to form a scanning probe tip for microscopy;

wet etching the <100> silicon substrate along the <111> plane with an anisotropic wet etch to fabricate the depression in the form of an inverted pyramid-shaped opening with a 4-pointed scanning probe tip;

sharpening the 4-pointed scanning probe tip by growing silicon dioxide on the sidewalls of the pyramid-shaped opening of the <100> silicon substrate;

depositing via atomic layer deposition (ALD) 1 nm of aluminum oxide ($Al_2O_3$) on the sidewalls of the inverted pyramid-shaped opening in the <100> silicon substrate;

depositing a tungsten layer disposed on the sidewalls of the inverted pyramid-shaped opening in the <100> silicon substrate via radio frequency (RF) sputtering with an argon gas flow rate of about 30 sccm, and RF power of about 150 W at room temperature;

depositing a seed layer comprising nanocrystalline diamond particles from an organic ultrasonic bath onto the tungsten layer, wherein the nanocrystalline diamond particles have grain sizes between about 10 nm and about 200 nm and in a nucleation density between about $10^{10}$ sites/cm$^2$ and $10^{12}$ sites/cm$^2$.

23. The method of claim 22, wherein the step of depositing diamond on the seed crystals to form a scanning probe tip comprises:

depositing a ultrananocrystalline diamond on the seed layer under conditions in the chamber of:

an argon gas flow rate of about 49.2 sccm;

a methane gas flow rate of about 0.8 sccm;

a pressure of 200 mbar;

a substrate temperature of 800° C.;

a microwave power of 1200 W; and a deposition time of 20 minutes.

24. The method of claim 23, wherein the ultrananocrystalline diamond comprises grains of an average size between about 2 nm and about 20 nm.

25. The method of claim 22, wherein the step of depositing diamond on the seed crystals to form a scanning probe tip comprises:

providing at least one hot filament in the chamber;

providing at least one vapor to the reaction chamber, wherein the vapor provided to the reaction chamber comprises methane ($CH_4$) and hydrogen ($H_2$), wherein the vapor is substantially free of noble and inert gas;

depositing ultrananocrystalline diamond on the seed crystals during a reaction with the vapor in the chamber at a pressure less than about 10 torr, and a filament temperature of at least about 2,350° C.

26. The method of claim 25, wherein the ultrananocrystalline diamond comprises grains of an average size between about 2 nm and about 10 nm.

27. The method according to claim 1, wherein the refractory layer is a tungsten layer.

28. A method comprising:

providing a substrate, wherein the substrate has a depression adapted to form a scanning probe tip;

depositing a refractory metal layer disposed on the depression in the substrate;

depositing a seed layer comprising seed crystals on the refractory metal layer;

depositing diamond on the seed crystals to form the scanning probe tip; and separating the scanning probe tip from the depression in the substrate; wherein the substrate comprises silicon.

29. The method of claim 28, wherein the step of providing a substrate comprises:

forming a depression by fabricating a pyramid-shaped opening; and sharpening the pyramid-shaped opening to form a sharp 4-pointed, scanning probe tip.

30. The method of claim 28, wherein the substrate comprises <100> silicon.

31. The method of claim 28, wherein the step of providing the single crystal silicon substrate comprises:

wet etching the single crystal silicon substrate along the <111> plane with an anisotropic wet etch to fabricate the depression in the form of an inverted pyramid-shaped opening with a 4-pointed scanning probe tip.

32. The method of claim 28, wherein the refractory metal layer is a tungsten layer.

33. The method of claim 28, wherein the refractory metal layer consists essentially of tungsten.

* * * * *